United States Patent
Saito et al.

(10) Patent No.: US 9,853,141 B2
(45) Date of Patent: Dec. 26, 2017

(54) SEMICONDUCTOR DEVICE WITH FRONT AND REAR SURFACE ELECTRODES ON A SUBSTRATE HAVING ELEMENT AND CIRCUMFERENTIAL REGIONS, AN INSULATING GATE TYPE SWITCHING ELEMENT IN THE ELEMENT REGION BEING CONFIGURED TO SWITCH BETWEEN THE FRONT AND REAR SURFACE ELECTRODES

(71) Applicants: Jun Saito, Nagoya (JP); Hirokazu Fujiwara, Miyoshi (JP); Tomoharu Ikeda, Nisshin (JP); Yukihiko Watanabe, Nagoya (JP); Toshimasa Yamamoto, Ichinomiya (JP)

(72) Inventors: Jun Saito, Nagoya (JP); Hirokazu Fujiwara, Miyoshi (JP); Tomoharu Ikeda, Nisshin (JP); Yukihiko Watanabe, Nagoya (JP); Toshimasa Yamamoto, Ichinomiya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 15/107,132

(22) PCT Filed: Aug. 4, 2014

(86) PCT No.: PCT/JP2014/070522
§ 371 (c)(1),
(2) Date: Jun. 22, 2016

(87) PCT Pub. No.: WO2015/098169
PCT Pub. Date: Jul. 2, 2015

(65) Prior Publication Data
US 2017/0040446 A1     Feb. 9, 2017

(30) Foreign Application Priority Data
Dec. 26, 2013 (JP) .................................. 2013-269268

(51) Int. Cl.
*H01L 29/15* (2006.01)
*H01L 29/78* (2006.01)
(Continued)

(52) U.S. Cl.
CPC .... *H01L 29/7813* (2013.01); *H01L 21/76237* (2013.01); *H01L 29/0619* (2013.01);
(Continued)

(58) Field of Classification Search
None
See application file for complete search history.

(56) References Cited

U.S. PATENT DOCUMENTS

2006/0289928 A1* 12/2006 Takaya ................ H01L 29/0623
257/330
2008/0042172 A1   2/2008 Hirler et al.
(Continued)

FOREIGN PATENT DOCUMENTS

JP     H11-87698 A     3/1999
JP     2005-116822 A   4/2005
(Continued)

*Primary Examiner* — Cory Eskridge
(74) *Attorney, Agent, or Firm* — Oliff PLC (57) ABSTRACT

Higher voltage resistance is accomplished by expanding a depletion layer more quickly within a circumferential region. A semiconductor device includes an element region, in which an insulated gate type switching element is provided, and the circumferential region. A first trench and a second trench spaced apart from the first trench are provided in the front surface in the circumferential region. Insulating films are provided in the first trench and the second trench. A fourth region of the second conductivity type is provided so as to extend from a bottom surface of the first trench to
(Continued)

a bottom surface of the second trench. A fifth region of the first conductivity type continuous from the third region is provided under the fourth region.

2 Claims, 4 Drawing Sheets

(51) Int. Cl.
    *H01L 29/06* (2006.01)
    *H01L 21/762* (2006.01)
    *H01L 29/10* (2006.01)
    *H01L 29/167* (2006.01)
    *H01L 29/739* (2006.01)
    *H01L 29/16* (2006.01)

(52) U.S. Cl.
    CPC ...... *H01L 29/0623* (2013.01); *H01L 29/0649* (2013.01); *H01L 29/105* (2013.01); *H01L 29/167* (2013.01); *H01L 29/7811* (2013.01); *H01L 29/16* (2013.01); *H01L 29/1608* (2013.01); *H01L 29/7395* (2013.01)

(56) References Cited

U.S. PATENT DOCUMENTS

| 2008/0042182 A1* | 2/2008 | Park | H01L 27/10852 |
| | | | 257/306 |
| 2009/0206913 A1* | 8/2009 | Zeng | H01L 29/0615 |
| | | | 327/534 |

FOREIGN PATENT DOCUMENTS

| JP | 2005-223349 A | | 8/2005 |
| JP | 2005223349 A | * | 8/2005 |
| JP | 2008-103683 A | | 5/2008 |
| JP | 2008-135522 A | | 6/2008 |
| JP | 2008-270681 A | | 11/2008 |
| JP | 2008270681 A | * | 11/2008 |
| JP | 2010-114152 A | | 5/2010 |
| JP | 2011-512676 A | | 4/2011 |

* cited by examiner

SEMICONDUCTOR DEVICE WITH FRONT AND REAR SURFACE ELECTRODES ON A SUBSTRATE HAVING ELEMENT AND CIRCUMFERENTIAL REGIONS, AN INSULATING GATE TYPE SWITCHING ELEMENT IN THE ELEMENT REGION BEING CONFIGURED TO SWITCH BETWEEN THE FRONT AND REAR SURFACE ELECTRODES

CROSS-REFERENCE TO RELATED APPLICATIONS

This application is a related application of Japanese Patent Application No. 2013-269268 filed on Dec. 26, 2013 and claims priority to this Japanese Patent Application, the entire contents of which are hereby incorporated by reference into the present application.

TECHNICAL FIELD

The technique disclosed in this description relates to a semiconductor device.

BACKGROUND ART

Japanese Patent Application Publication No. 2008-135522 (hereinbelow referred to as Patent Literature 1) discloses a semiconductor device including a cell region in which a MOS structure is provided, and a circumferential region on a periphery of the cell region. A plurality of trenches is provided in the circumferential region so as to circumscribe the cell region, and an insulating layer is filled in each trench. A p-type bottom-surface surrounding region is provided at a lower end of each trench in the circumferential region. When a MOSFET is turned off, a depletion layer extends from the cell region to the circumferential region. At this occasion, the respective bottom-surface surrounding regions enhance the extension of the depletion layer. Due to this, a high voltage resistance can be obtained by this structure.

SUMMARY

Technical Problem

In the semiconductor device of Patent Literature 1, when the depletion layer extending from the cell region reaches the first bottom-surface surrounding region in the circumferential region (the bottom-surface surrounding region closest to the cell region), the depletion layer extends from the first bottom-surface surrounding region toward the second bottom-surface surrounding region (the second bottom-surface surrounding region from the cell region). When the depletion layer reaches the second bottom-surface surrounding region, the depletion layer extends from the second bottom-surface surrounding region toward the third bottom-surface surrounding region. As above, the depletion layer gradually extends through the respective bottom-surface surrounding regions, so a speed by which the depletion layer extends is not so fast. Thus, in this description, a technique is provided that can facilitate high voltage resistance by expanding the depletion layer quickly within the circumferential region.

Solution to Problem

A semiconductor device disclosed herein comprises a semiconductor substrate; a front surface electrode provided on a front surface of the semiconductor substrate; and a rear surface electrode provided on a rear surface of the semiconductor substrate. The semiconductor substrate comprises: an element region in which an insulated gate type switching element configured to switch between the front surface electrode and the rear surface electrode is provided, and a circumferential region adjacent to the element region. The insulated gate type switching element comprises: a first region of a first conductivity type connected to the front surface electrode; a second region of a second conductivity type connected to the front surface electrode and being in contact with the first region; a third region of the first conductivity type provided under the second region and separated from the first region by the second region; a gate insulating film being in contact with the second region; and a gate electrode facing the second region via the gate insulating film. A first trench and a second trench spaced apart from the first trench are provided in the front surface in the circumferential region. Insulating films are provided in the first trench and the second trench. A fourth region of the second conductivity type is provided so as to extend from a bottom surface of the first trench to a bottom surface of the second trench. A fifth region of the first conductivity type continuous from the third region is provided under the fourth region.

In this semiconductor device, the first trench and the second trench are provided in the circumferential region, and the fourth region is provided across the bottom surface of the first trench and the bottom surface of the second trench. When the insulated gate type switching element turns off, a depletion layer extends from the element region to the circumferential region. When the depletion layer reaches the fourth region, the depletion layer extends from an entirety of the fourth region into the fifth region. That is, a region under the plurality of trenches is depleted at once. Due to this, the depletion layer can quickly be expanded in the circumferential region. Due to this, this semiconductor device has a high voltage resistance.

In the above mentioned semiconductor device, a low area density region may be provided in a region within the fourth region and between the first trench and the second trench. An area density of second conductivity type impurities measured along a thickness direction of the semiconductor substrate may be lower in the low area density region than in a region within the fourth region and under the first trench and in a region within the fourth region and under the second trench. The region under the first trench may be separated from the region under the second trench by the low area density region.

Notably, the aforementioned "region between the first trench and the second trench" refers to the fourth region that is positioned between the first trench and the second trench when the semiconductor substrate is seen in a plan view along its thickness direction.

According to this configuration, upon when the insulated gate type switching element turns off, the low area density region can be depleted. When the low area density region is depleted, the fourth region on a first trench side is separated from the fourth region on a second trench side by the depletion layer. Due to this, a potential difference can be generated within the fourth region, and a potential can be distributed in the circumferential region more evenly. Due to this, such a semiconductor device has even a higher voltage resistance.

In the above mentioned semiconductor device, the semiconductor substrate may be configured of SiC, and the area density in the low area density region may be lower than $3.2 \times 10^{13}$ cm$^{-2}$.

In the above mentioned semiconductor device, the semiconductor substrate may be configured of Si, and the area density in the low area density region may be lower than $2.0 \times 10^{12}$ cm$^{-2}$.

According to this configuration, the low area density region can be depleted.

In the above mentioned semiconductor device, the semiconductor substrate may be configured of SIC, and the area density in the region under the first trench and the area density in the region under the second trench may be equal to or higher than $1.5 \times 10^{13}$ cm$^{-2}$.

In the above mentioned semiconductor device, the semiconductor substrate may be configured of Si, and the area density in the region under the first trench and the area density in the region under the second trench are equal to or higher than $1.9 \times 10^{19}$ cm$^{-2}$.

According to this configuration, the region under the first trench and the second trench can be suppressed from being depleted. Due to this, upon when the insulated gate type switching element turns off, a generation of a high electric field in a vicinity of a lower end of each trench can be suppressed.

In the above mentioned semiconductor device, the fourth region may contain B and Al. In a region within the fourth region and under the first trench, a density ratio of B with respect to Al may become larger at a position farther away from the bottom surface of the first trench. In a region within the fourth region and under the second trench, a density ratio of B with respect to Al may become larger at a position farther away from the bottom surface of the second trench.

According to this configuration, a second conductivity type impurity concentration of the fourth region under the first trench and the second trench can be made high, and a second conductivity type impurity concentration of the fourth region between the first trench and the second trench can be made low.

In the above mentioned semiconductor device, a gate trench may be provided in the front surface of the semiconductor substrate in the element region. A gate insulating film and a gate electrode may be provided in the gate trench. A sixth region of the second conductivity type including Al may be provided in a range in the semiconductor substrate. The range may include a bottom surface of the gate trench.

According to this configuration, the sixth region having a high second conductivity type impurity concentration can be provided in the range including the bottom surface of the gate trench. Due to this, a generation of a high electric field in a vicinity of a lower end of the gate trench can be suppressed.

DETAILED DESCRIPTION

First Embodiment

Figure 1:
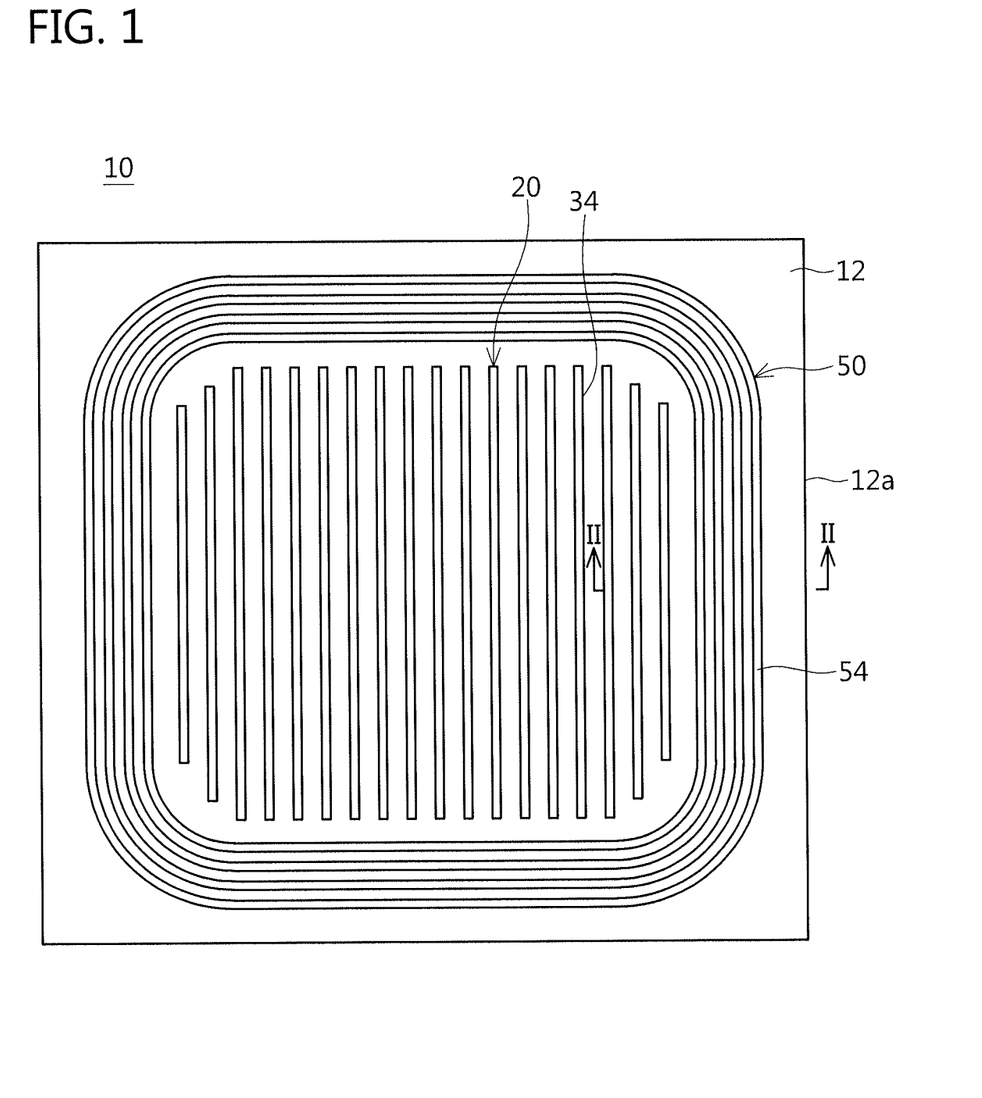
FIG. 1 is an upper view of a semiconductor device 10 (a diagram that omits depiction of an electrode and insulating films on a front surface)

A semiconductor device 10 shown in FIG. 1 comprises a semiconductor substrate 12 configured of SIC. The semiconductor substrate 12 comprises a cell region 20 and a circumferential region 50. The cell region 20 includes a MOSFET provided therein. The circumferential region 50 is a region between the cell region 20 and end faces 12a of the semiconductor substrate 12.

Figure 2:
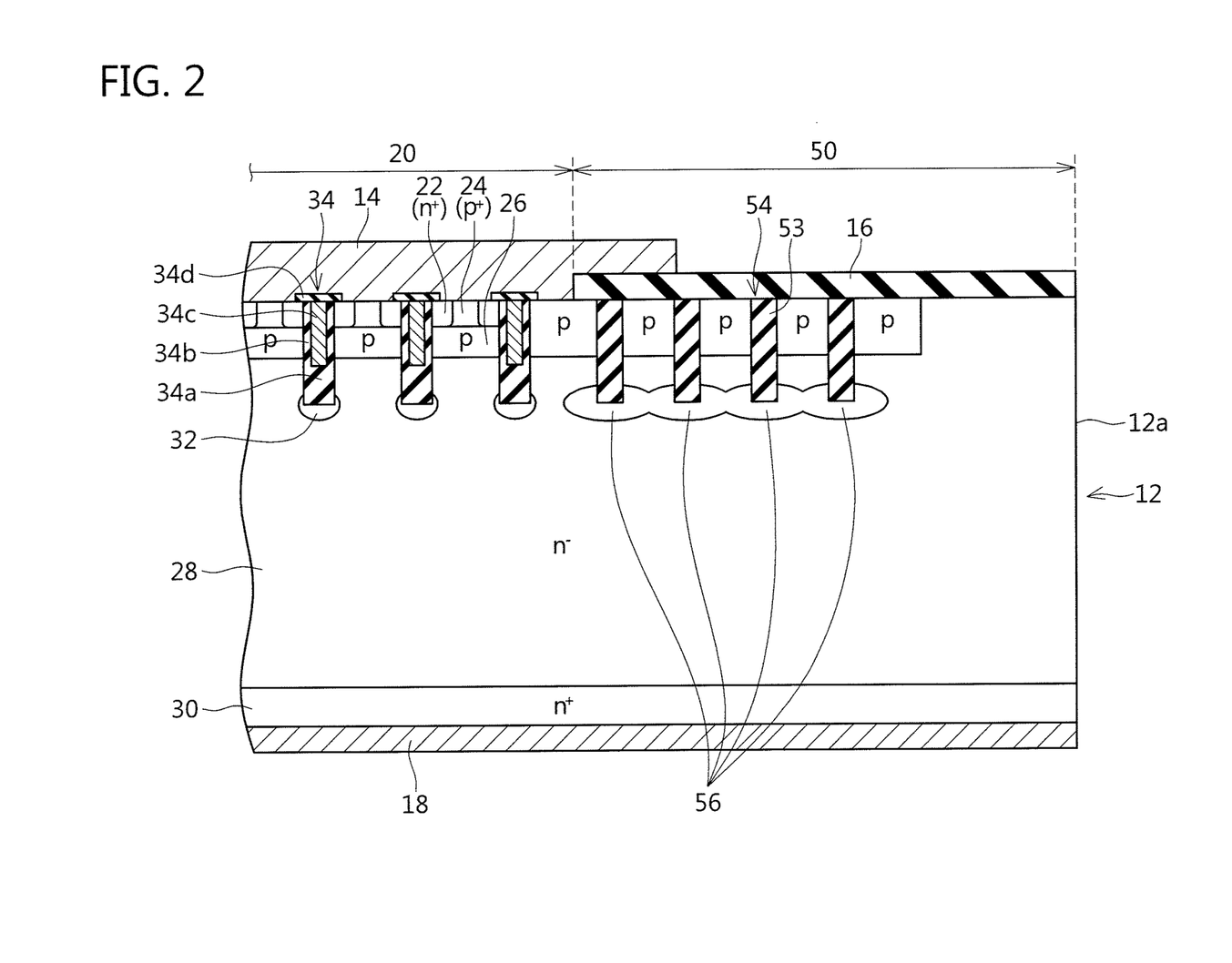
FIG. 2 is a vertical cross-sectional view of the semiconductor device 10 along a line II-II in FIG. 1.

As shown in FIG. 2, a front surface electrode 14 and an insulating film 16 are provided on a front surface of the semiconductor substrate 12. The insulating film 16 covers the front surface of the semiconductor substrate 12 within the circumferential region 50. The front surface electrode 14 is in contact with the semiconductor substrate 12 within the cell region 20. In other words, a region under a contact region where the front surface electrode 14 is in contact with the semiconductor substrate 12 is the cell region 20, and a region on an outer circumferential side (end face 12a side) than the contact region is the circumferential region 50. A rear surface electrode 18 is provided on a rear surface of the semiconductor substrate 12. The rear surface electrode 18 covers substantially an entirety of the rear surface of the semiconductor substrate 12.

Source regions 22, body contact regions 24, a body region 26, a drift region 28, a drain region 30, p-type floating regions 32, and gate trenches 34 are provided in the cell region 20.

The source regions 22 are n-type regions containing n-type impurities at a high concentration. The source regions 22 are provided within ranges that are exposed on an upper surface of the semiconductor substrate 12. The source regions 22 make an ohmic connection to the front surface electrode 14.

The body contact regions 24 are a p-type region containing p-type impurities at a high concentration. The body contact regions 24 are provided to be exposed on the upper surface of the semiconductor substrate 12 at a position where the source regions 22 are not provided. The body contact regions 24 make an ohmic connection to the front surface electrode 14.

The body region 26 is a p-type region containing p-type impurities at a low concentration. The p-type impurity concentration of the body region 26 is lower than the p-type impurity concentration of the body contact regions 24. The body region 26 is provided under the source regions 22 and the body contact regions 24, and is in contact with these regions.

The drift region 28 is an n-type region containing n-type impurities at a low concentration. The n-type impurity concentration of the drift region 28 is lower than the n-type impurity concentration of the source regions 22. The drift region 28 is provided under the body region 26. The drift region 28 is in contact with the body region 26, and is separated from the source regions 22 by the body region 26.

The drain region 30 is an n-type region containing n-type impurities at a high concentration. The n-type impurity concentration of the drain region 30 is higher than the n-type impurity concentration of the drift region 28. The drain region 30 is provided under the drift region 28. The drain region 30 is in contact with the drift region 28, and is separated from the body region 26 by the drift region 28. The drain region 30 is provided in a range that is exposed to a lower surface of the semiconductor substrate 12. The drain region 30 makes an ohmic connection to the rear surface electrode 18.

As shown in FIGS. 1 and 2, the plurality of gate trenches 34 is provided in the upper surface of the semiconductor substrate 12 within the cell region 20. Each of the gate trenches 34 extends straight and parallel to each other in the front surface of the semiconductor substrate 12. Each of the gate trenches 34 is configured to penetrate its corresponding source regions 22 and the body region 26, and reach the drift region 28. In each of the gate trenches 34, a bottom insulating layer 34a, a gate insulating film 34b, and a gate electrode 34c are provided. The bottom insulating layers 34a are thick insulating layers provided respectively at bottom portions of the gate trenches 34. Side surfaces of each gate trench 34 above the bottom insulating layer 34a are covered by the gate insulating film 34b. The gate electrodes 34c are provided inside the gate trenches 34 above the bottom insulating layers 34a. The gate electrodes 34c face the source regions 22, the body region 26, and the drift region 28 via the gate insulating films 34b. The gate electrodes 34c are insulated from the semiconductor substrate 12 by the gate insulating films 34b and bottom insulating layers 34a. An upper surface of each gate electrode 34c is covered by an insulating layer 34d. The gate electrodes 34c are insulated from the front surface electrode 14 by the insulating layers 34d.

The p-type floating regions 32 are provided in ranges within the semiconductor substrate 12 that are respectively in contact with bottom surfaces of the gate trenches 34. Peripheries of the p-type floating regions 32 are surrounded by the drift region 28. The p-type floating regions 32 are separated from each other by the drift region 28.

The aforementioned body region 26, drift region 28, and drain region 30 extend to the circumferential region 50. The drift region 28 and the drain region 30 extend to end faces 12a of the semiconductor substrate 12. The body region 26 terminates within the circumferential region 50. The drift region 28 is provided between the body region 26 and the end faces 12a of the semiconductor substrate 12.

A plurality of circumferential trenches 54 is provided in the upper surface of the semiconductor substrate 12 in the circumferential region 50. The circumferential trenches 54 are configured to penetrate the body region 26 and reach the drift region 28. An insulating layer 53 is provided in each of the circumferential trenches 54. As shown in FIG. 1, the circumferential trenches 54 are provided in ring shapes that circumscribe the cell region 20 when the semiconductor substrate 12 is seen from above. Thus, the body region 26 in the circumferential region 50 is separated from the body region 26 in the cell region 20. Each of the circumferential trenches 54 is separated from each other with intervals in between.

P-type regions 56 are provided in ranges within the semiconductor substrate 12 that are in contact with bottom surfaces of the circumferential trenches 54. The bottom surface regions 56 are respectively provided along the circumferential trenches 54 so as to cover entireties of the bottom surfaces of the circumferential trenches 54. Each of the p-type regions 56 is connected to the other adjacent p-type regions 56.

Figure 3:
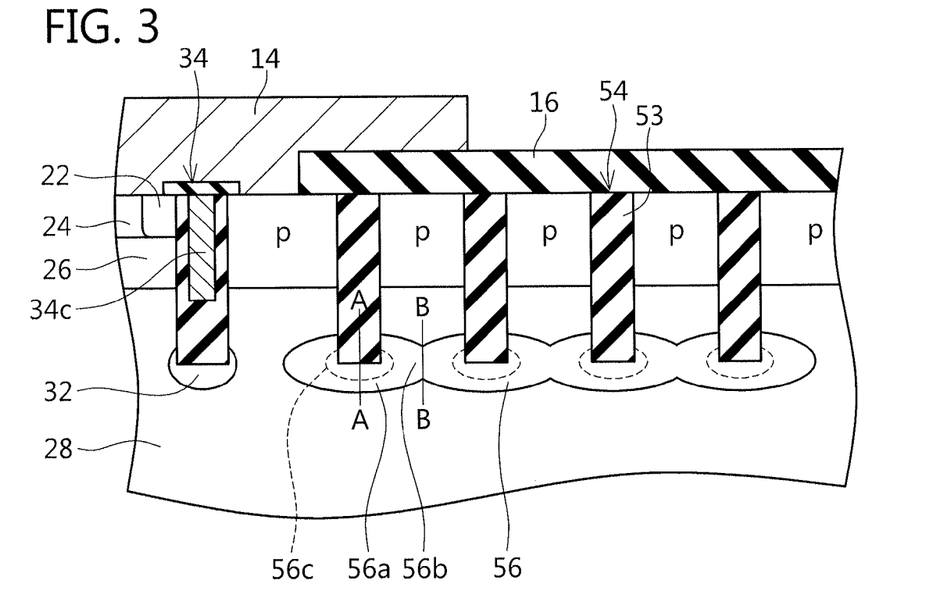
FIG. 3 is an enlarged view of a p-type region 56.

FIG. 3 shows an enlarged view of the respective p-type regions 56 in FIG. 2. Within the p-type regions 56, each region 56b positioned between two circumferential trenches 54 has a higher area density of p-type impurities in a thickness direction than each region 56a under each of the circumferential trenches 54 within the p-type regions 56. Notably, the area density in the regions 56a is a value that integrated the p-type impurity concentration of the regions 56a along the thickness direction of the semiconductor substrate 12 (that is, a value that integrated the p-type impurity concentration along a line A-A in FIG. 3), and the area density of the regions 56b is a value that integrated the p-type impurity concentration of the regions 56b along the thickness direction of the semiconductor substrate 12 (that is, a value that integrated the p-type impurity concentration along a line B-B in FIG. 3). Hereinbelow, the regions 56b will be termed low area density regions, and the regions 56a will be termed high area density regions.

Next, an operation of the semiconductor device 10 will be described. Upon operating the semiconductor device 10, a voltage that brings the rear surface electrode 18 to be charged positively is applied between the rear surface electrode 18 and the front surface electrode 14. Moreover, the MOSFET in the cell region 20 turns on by a gate-on voltage being applied to the gate electrodes 34c. That is, channels are generated in the body region 26 at positions facing the gate electrodes 34c, and electrons flow from the front surface electrode 14 toward the rear surface electrode 18 through the source regions 22, the channels, the drift region 28, and the drain region 30.

When the application of the gate-on voltage to the gate electrode 34c is stopped, the channels disappear and the MOSFET turns off. When the MOSFET turns off, a depletion layer extends from a pn junction at a boundary between the body region 26 and the drift region 28 into the drift region 28. When the depletion layer reaches the p-type floating regions 32 in the cell region 20, the depletion layer extends from the p-type floating regions 32 into the drift region 28 as well. Due to this, the drift region 28 between pairs of p-type floating regions 32 is depleted effectively. Accordingly, a high voltage resistance in the cell region 20 is thereby facilitated.

Further, the aforementioned depletion layer extending from the pn junction reaches the p-type region 56 under the circumferential trench 54 positioned closest to the cell region 20 side. Then, due to all of the p-type regions 56 being connected, the depletion layer extends from all of the p-type regions 56 into the drift region 28. Accordingly, in the semiconductor device 10 of the present embodiment, the depletion layer extends into the drift region 28 substantially simultaneously from the p-type regions 56 under the respective circumferential trenches 54, so the expansion of the depletion layer in the circumferential region 50 is extremely fast.

Further, the depletion layer extends within the p-type regions 56 as well. At this occasion, the respective low area density regions 56b are depleted over their entireties in the thickness direction, while in the respective high area density regions 56a, the depletion layer does not extend to regions 56c shown by dotted lines in FIG. 3 (regions 56c covering the bottom surfaces of the circumferential trenches 54). This is because the area density is high in the high area density regions 56a. Accordingly, due to the p-type regions 56c at the lower ends of the circumferential trenches 54 not being depleted, a concentration of an electric field in vicinities of the lower ends of the circumferential trenches 54 is suppressed. Further, when the low area density regions 56b are depleted, the p-type regions 56c under the circumferential trenches 54 are separated from each other by the depletion layer. Due to this, a potential difference is generated between each circumferential trench 54. Due to this, a potential can be distributed evenly within the circumferential region 50.

As described above, in this semiconductor device 10, the depletion layer can be expanded quickly within the circumferential region 50 since the depletion layer expands from the entireties of the p-type regions 56 in the circumferential region 50. Further, since the p-type regions 56c under the circumferential trenches 54 are separated from each other when they are depleted, the potential can be distributed among the circumferential trenches 54. Further, even in the event where the depletion has expanded within the circumferential region 50, the electric field concentration at the lower ends of the circumferential trenches 54 can be suppressed due to the p-type regions 56c remaining under the circumferential trenches 54. Due to this, this semiconductor device 10 has a high voltage resistance.

Notably, in a case of completely depleting the low area density regions 56b, the area density of the low area density regions 56b is preferably less than $3.2 \times 10^{13}$ cm$^{-2}$. In a region with an area density higher than this value, a voltage required for its depletion would exceed an avalanche voltage resistance, thus it cannot be depleted. If the area density is lower than this value, it is possible to deplete the low area density regions 56b over their entireties in the thickness direction by adjusting the voltage, and the aforementioned effect can be achieved. Notably, if the semiconductor substrate 12 is Si, the low area density regions 56b can be depleted completely by setting the area density to be less than $2.0 \times 10^{12}$ cm$^{-2}$.

Figure 4:
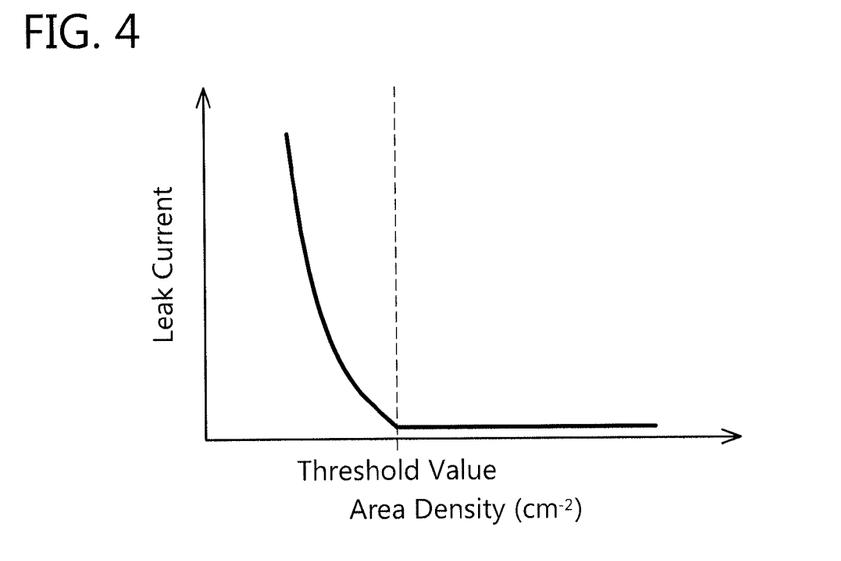
FIG. 4 is a graph showing a relationship between an area density and a leak current.

Further, in a case of not depleting the high area density regions 56a, the area density of the high area density regions 56a is preferably equal to or higher than $1.5 \times 10^{13}$ cm$^{-2}$. FIG. 4 is a graph showing a relationship between the area density of the high area density regions 56a and a leak current that flows in vicinities of the circumferential trenches 54. With an application voltage at practical level, as shown, the leak current can be minimized when the area density is equal to or higher than a predetermined threshold. In a case where the semiconductor substrate 12 is configured of SiC, this threshold is $1.5 \times 10^{13}$ cm$^{-2}$. Thus, the area density of the high area density regions 56a is preferably $1.5 \times 10^{13}$ cm$^{-2}$. However, in a case of more surely preventing the depletion of the high area density regions 56a, the area density of the high area density regions 56a may be set to equal to or higher than $3.2 \times 10^{13}$ cm$^{-2}$. Further, in the case where the semiconductor substrate 12 is configured of Si, the threshold is $1.9 \times 10^{19}$ cm$^{-2}$. Thus, the area density of the high area density regions 56a is preferably equal to or higher than $1.9 \times 10^{19}$ cm$^{-2}$. However, in the case of more surely preventing the depletion of the high area density regions 56a, the area density of the high area density regions 56a may be set to equal to or higher than $2.0 \times 10^{12}$ cm$^{-2}$.

Notably, the aforementioned p-type regions 56 can be formed as follows. Firstly, the circumferential trenches 54 are formed in the circumferential region 50. Then, p-type impurities (for example, B (boron)) are implanted to the bottom surfaces of the circumferential trenches 54, after which the boron is diffused. When the p-type regions 56 are formed as above, the concentration of the boron becomes high in the vicinities of the lower ends of the trenches, and the concentration of the boron becomes lower at positions that are more apart from the lower ends of the trenches. Thus, the low area density regions 56b and the high area density regions 56a can be distributed as aforementioned. Notably, the p-type impurities may be implanted again to the bottom surfaces of the trenches after the diffusion step of the p-type impurities. According to this method, the p-type impurity concentration in the vicinities of the lower ends of the trenches can further be increased.

Second Embodiment

Figure 5:
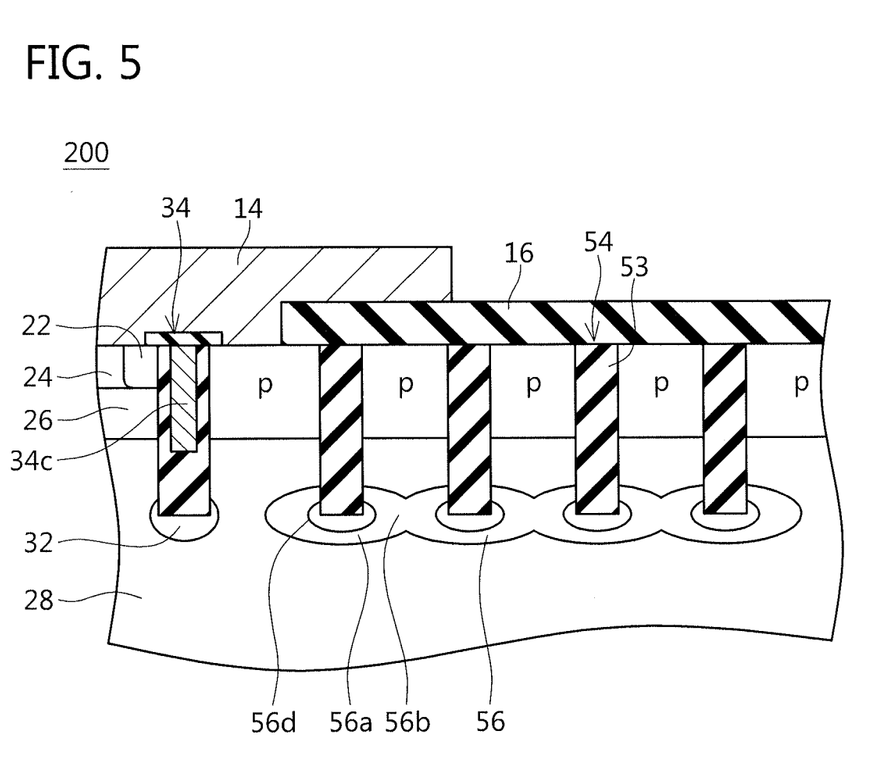
FIG. 5 is an enlarged view of a p-type region 56 of a second embodiment.

In a semiconductor device 200 of the second embodiment, the p-type regions 56 contain Al (aluminum) and B as their p-type impurities. Ranges in which Al is distributed is primarily in the vicinities of the lower ends of the circumferential trenches 54. B is widely distributed from the lower ends of the circumferential trenches 54 to their peripheries. Due to this, in the p-type regions 56, a density ratio of Al is high in the vicinities of the lower ends of the circumferential trenches 54, and a density ratio of B with respect to Al increases at positions that are more apart from the lower ends of the circumferential trenches 54. Notably, in the second embodiment as well, the area density of the low area density regions 56b is lower than the area density of the high area density regions 56a. Further, in the semiconductor device 200 of the second embodiment, the floating regions 32 in the cell region 20 contain Al as their p-type impurities.

The p-type regions 56 and the floating regions 32 in the semiconductor device 200 of the second embodiment are formed as follows. Firstly, the gate trenches 34 and the circumferential trenches 54 are formed on the front surface of the semiconductor substrate 12. These may be formed simultaneously, or may be formed separately. Next, Al is implanted in the bottom surfaces of the gate trenches 34 and the bottom surfaces of the circumferential trenches 54. Then, B is implanted in the bottom surfaces of the circumferential trenches 54. This implantation of B is performed so that B is not implanted to the bottom surfaces of the gate trenches 34. Thereafter, the semiconductor substrate 12 is heated to diffuse Al and B that have been implanted. Since a diffusion coefficient for Al in SiC is small, Al is distributed in the vicinities of the bottom surfaces of the gate trenches 34 and in the vicinities of the bottom surfaces of the circumferential trenches 54. Due to this, each of the floating regions 32 is formed in a state of being separated from other floating regions 32. Further, each Al distributed region 56d containing large quantity of Al within the p-type regions 56 is formed in a state of being separated from other Al distributed regions 56d. Further, since the Al has difficulty as to being diffused, the Al concentration in the floating regions 32 and the Al distributed regions 56d is high. Contrary to this, since a diffusion coefficient for B in SiC is large, B is widely diffused in the peripheries of the bottom surfaces of the circumferential trenches 54 after the diffusion step. Due to this, widely distributed B enables the p-type regions 56 under the respective circumferential trenches 54 to connect to their adjacent other p-type regions 56. Thus, as shown in FIG. 5, the p-type regions 56 are thereby formed.

The semiconductor device 200 of the second embodiment operates substantially similar to the semiconductor device 10 of the first embodiment. That is, upon when the MOSFET is off, the depletion layer extends in the drift region 28 from the entireties of the p-type regions 56. At this occasion, the low area density regions 56b within the p-type regions 56 are depleted over their entireties in the thickness direction. Due to this, the respective high area density regions 56a (that is, Al distributed regions 56d) are separated from each other, and the potential distribution of the circumferential region 50 is made uniform. Further, since the regions in the vicinities of the lower ends of the circumferential trenches 54 within the high area density regions 56a are not depleted, the electric field is suppressed from concentrating at the lower ends of the circumferential trenches 54. Accordingly, the semiconductor device 200 of the second embodiment also has a high voltage resistance.

Notably, in the aforementioned first and second embodiments, the circumferential trenches 54 are formed in ring shapes that circumscribe the periphery of the cell region 20, however, the circumferential trenches 54 do not necessarily need to be in such a ring shape. For example, the circumferential trenches 54 may be provided only partially in the circumferential region 50 at portions where voltage resistance becomes problematic.

Further, in the aforementioned first and second embodiments, the circumferential trenches 54 are provided between the cell region 20 and the end faces 12a of the semiconductor substrate 12, however, they may be provided at other locations. For example, a circumferential trench 54 may be provided between two element regions 20.

Further, in the aforementioned embodiments, the MOSFET is provided in the cell region 20, however, an IGBT may be provided.

Further, in the aforementioned embodiments, the body region 26 extends into the circumferential region 50, however, the body region 26 may not be provided in the circumferential region 50.

Further, in the aforementioned embodiments, the p-type floating regions 32 are provided at the lower ends of the gate trenches 34, however, p-type regions connected to a predetermined potential may be provided instead of the p-type floating regions 32.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

REFERENCE SIGNS LIST

10: Semiconductor Device
12: Semiconductor Substrate
14: Front Surface Electrode
18: Rear Surface Electrode
20: Cell Region
22: Source Region
24: Body Contact Region
26: Body Region
28: Drift Region
30: Drain Region
32: Floating Region
34: Gate Trench
50: Circumferential Region
54: Circumferential Trench
56: P-Type Region
56a: High Area Density Region
56b: Low Area Density Region

The invention claimed is:

1. A semiconductor device comprising:
a semiconductor substrate;
a front surface electrode provided on a front surface of the semiconductor substrate; and
a rear surface electrode provided on a rear surface of the semiconductor substrate;
the semiconductor substrate comprising:
an element region in which an insulated gate type switching element configured to switch between the front surface electrode and the rear surface electrode is provided; and
a circumference region adjacent to the element region,
the insulated gate type switching element comprising:
a first region of a first conductivity type connected to the front surface electrode;
a second region of a second conductivity type connected to the front surface electrode and being in contact with the first region;
a third region of the first conductivity type provided under the second region and separated from the first region by the second region;
a gate trench provided in the front surface in the element region,
a gate insulating film provided in the gate trench and being in contact with the second region;
a gate electrode provided in the gate trench and facing the second region via the gate insulating film, and
a sixth region of the second conductivity type provided in a range in the semiconductor substrate, the range including a bottom surface of the gate trench,
wherein
a first trench and a second trench spaced apart from the first trench are provided in the front surface in the circumference region,
insulating films are provided in the first trench and the second trench,
a fourth region of the second conductivity type is provided so as to extend from a bottom surface of the first trench to a bottom surface of the second trench,
a fifth region of the first conductivity type continuous from the third region is provided under the fourth region,
a low area density region is provided in a region within the fourth region and between the first trench and the second trench,
a first specific region is provided in a region within the fourth region and under the first trench,
a second specific region is provided in a region within the fourth region and under the second trench,
an area density of second conductive type impurities measured along a thickness direction of the semiconductor substrate is lower in the low area density region than in the first specific region and the second specific region, and
when a maximum rated voltage is applied to the insulated gate type switching device in an off state
the low area density region is depleted,
at least a part of the first specific region and at least a part of the second specific region are not depleted, and
the at least a part of the first specific region not depleted and the at least a part of the second specific region not depleted are separated from each other by a depleted layer formed in the low area density region.

2. A semiconductor device comprising:
a semiconductor substrate;
a front surface electrode provided on a front surface of the semiconductor substrate; and
a rear surface electrode provided on a rear surface of the semiconductor substrate;

the semiconductor substrate comprising:
an element region in which an insulated gate type switching element configured to switch between the front surface electrode and the rear surface electrode is provided; and
a circumference region adjacent to the element region,
the insulated gate type switching element comprising:
a first region of a first conductivity type connected to the front surface electrode;
a second region of a second conductivity type connected to the front surface electrode and being in contact with the first region;
a third region of the first conductivity type provided under the second region and separated from the first region by the second region;
a gate trench provided in the front surface in the element region,
a gate insulating film provided in the gate trench and being in contact with the second region;
a gate electrode provided in the gate trench and facing the second region via the gate insulating film, and
a sixth region of the second conductivity type provided in a range in the semiconductor substrate, the range including a bottom surface of the gate trench, wherein
a first trench and a second trench spaced apart from the first trench are provided in the front surface in the circumference region,
insulating films are provided in the first trench and the second trench,
a fourth region of the second conductivity type is provided so as to extend from a bottom surface of the first trench to a bottom surface of the second trench,
a fifth region of the first conductivity type continuous from the third region is provided under the fourth region,
the fourth region includes B and Al,
in a region within the fourth region and under the first trench, a density ratio of B with respect to Al increases with increasing distance from the bottom surface of the first trench, and
in a region within the fourth region and under the second trench, a density ratio of B with respect to Al increases with increasing distance from the bottom surface of the second trench.

* * * * *